United States Patent
Chang et al.

(10) Patent No.: US 6,219,039 B1
(45) Date of Patent: Apr. 17, 2001

(54) COMPACT PC VIDEO SUBSYSTEM TESTER

(75) Inventors: Luke L. Chang; Collin Cooke, both of Austin, TX (US)

(73) Assignee: Dell USA, L.P., Round Rock, TX (US)

( * ) Notice: Subject to any disclaimer, the term of this patent is extended or adjusted under 35 U.S.C. 154(b) by 0 days.

(21) Appl. No.: 09/237,770

(22) Filed: Jan. 26, 1999

(51) Int. Cl.[7] .............................. G09G 5/00; G01R 31/00; H01H 31/02
(52) U.S. Cl. .................... 345/204; 324/407; 324/539; 324/556; 345/904
(58) Field of Search .................................. 345/904, 204; 324/404, 407, 539, 542, 555, 556, 771

(56) References Cited

U.S. PATENT DOCUMENTS

| | | |
|---|---|---|
| 4,417,268 * | 11/1983 | Lasota ................................... 358/10 |
| 4,523,232 | 6/1985 | Kameda et al. . |
| 4,656,507 | 4/1987 | Greaves et al. . |
| 5,345,263 * | 9/1994 | Miller ................................... 348/182 |
| 5,394,171 | 2/1995 | Rabii . |
| 5,648,799 | 7/1997 | Kikinis . |
| 5,742,272 | 4/1998 | Flinders et al. . |
| 6,054,981 * | 4/2000 | Kimoto et al. ........................ 345/211 |

\* cited by examiner

*Primary Examiner*—Richard Hjerpe
*Assistant Examiner*—Duc Q. Dinh
(74) *Attorney, Agent, or Firm*—Haynes and Boone, L.L.P.

(57) ABSTRACT

Method and apparatus for testing the video subsystem of a PC in a manufacturing environment. Hsync and Vsync signals from a VGA connector of the PC are input to first and second trigger inputs, respectively, of a monostable multivibrator ("MM") of the test device to drive respective outputs thereof. In particular, the presence of Hsync at the first trigger input triggers the MM to output a positive pulse at a first output thereof; similarly, the presence of Vsync at the second trigger input triggers the MM to output a positive pulse at a second output thereof. Each of the first and second outputs is used to drive an LED, such that the presence of Hsync and/or Vsync results in the illumination of a corresponding LED.

19 Claims, 1 Drawing Sheet

US 6,219,039 B1

COMPACT PC VIDEO SUBSYSTEM TESTER

BACKGROUND

The disclosures herein relate generally to personal computer ("PC") test devices and, more particularly, to a compact PC video subsystem test device.

In a PC manufacturing environment, a large number of PCs are produced daily. Understandably, therefore, it is highly desirable for factory testing personnel, as well as development engineers, to be able to quickly and reliably test the basic functionality of, for example, the video subsystem of every PC. One method of accomplishing the forestated task is to connect a monitor to the PC and boot it up. During POST, a audible "beep code" will be output to indicate the status of the video subsystem; however, often, the status indicated by this beep code does not reveal the true status of the video subsystem. Moreover, the need to connect and subsequently disconnect a monitor to and from each PC in order to test the video subsystem thereof slows down the testing process. In addition, testing of the energy saving modes of every PC manufactured also currently necessitates the connection of a monitor or oscilloscope to the PC.

Accordingly, what is needed is a simple, convenient, and reliable method of performing video subsystem testing of a PC in a manufacturing environment that does not require a monitor to be attached to the PC to perform such testing.

SUMMARY

One embodiment, accordingly, provides a method and apparatus for testing the video subsystem of a PC in a manufacturing environment. Hsync and Vsync signals from a VGA connector of the PC are input to first and second trigger inputs, respectively, of a monostable multivibrator ("MM") of the test device to drive respective outputs thereof. In particular, the presence of Hsync at the first trigger input triggers the MM to output a positive pulse at a first output thereof; similarly, the presence of Vsync at the second trigger input triggers the MM to output a positive pulse at a second output thereof. Each of the first and second outputs is used to drive an LED, such that the presence of Hsync and/or Vsync results in the illumination of a corresponding LED. The test device is powered off of a +5V power supply from the video subsystem of the PC. When the subsystem is in one of the predefined energy saving modes, one or both of the Hsync and Vsync signals will be absent, resulting in the dimming of the corresponding LED(s).

A technical advantage achieved is that a monitor need not be connected to each PC to test the video subsystem thereof.

Another technical advantage achieved is that the test device is more reliable than a "beep code" during POST for indicating the status of the video subsystem of a PC.

Yet another technical advantage achieved is that the test device is highly compact and therefore easy to connect and disconnect from the PC before and after testing.

Still another technical advantage is that the test device is capable of determining the existence of these two signals regardless of their polarities, duty cycles, or frequencies.

DESCRIPTION OF A PREFERRED EMBODIMENT

Figure 1:
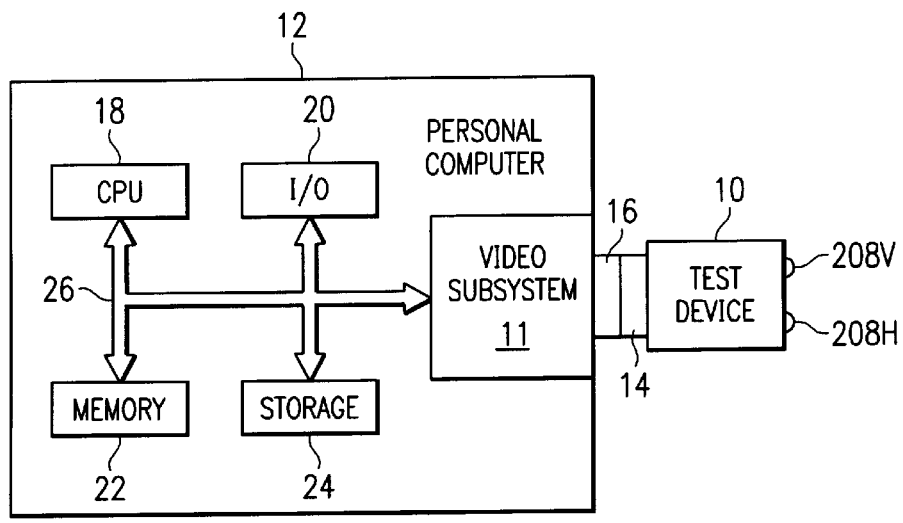
FIG. 1 is a block diagram of one embodiment of a compact PC video subsystem test device connected to a PC.

FIG. 1 is a partial block diagram of one embodiment of a compact PC video subsystem test device (hereinafter "test device") 10 connected for testing a video subsystem 11 of a PC 12. As shown in FIG. 1, a connector 14 of the test device 10 is designed to mate with a VGA connector 16 of the PC 12 such that signals output from the PC via the VGA connector are received and utilized by the test device as described in greater detail below with reference to FIG. 2.

It will be recognized that the PC 12 will include subsystems and devices in addition to the video subsystem 11, such as a CPU 18, I/O devices 20, memory 22, and storage devices 24, all interconnected via various buses, represented in FIG. 1 by a bus 26. As all of the aforementioned components of the PC 12 are well-known to those skilled in the art, they will not be further described except as necessary to impart a complete understanding of the embodiments described herein.

As will be recognized by those skilled in the art, the video subsystem of a PC, such as the video subsystem 11, outputs a variety of signals, including a Vertical Synchronization signal ("Vsync"), a Horizontal Synchronization signal ("Hsync"), RGB analog video signals ("RGB"), and Display Data Channel ("DDC") signals, to a monitor (not shown) via a VGA connector. The primary signals used to drive a monitor to display graphics properly are the Vsync, Hsync, and RGB signals; of these, Vsync and Hsync are of primary importance for the purposes to be described herein. In particular, Vsync and Hsync indicate whether the video subsystem 11 is working properly or not, as well as provide a basic timing reference to the monitor's internal timing circuitry. By checking the status of these two signals, it can be determined whether the video subsystem 11 is initialized properly during the POST, whether the basic circuits of the video subsystem are functioning correctly, and whether the proper energy saving states are being executed correctly.

To detect Vsync and Hsync, the fact that the polarities, as well as frequencies, of these two signals are varying among different video modes must be considered. Accordingly, as will become evident, the test device 10 is capable of determining the existence of these two signals regardless of their polarities, duty cycles, or frequencies.

Figure 2:
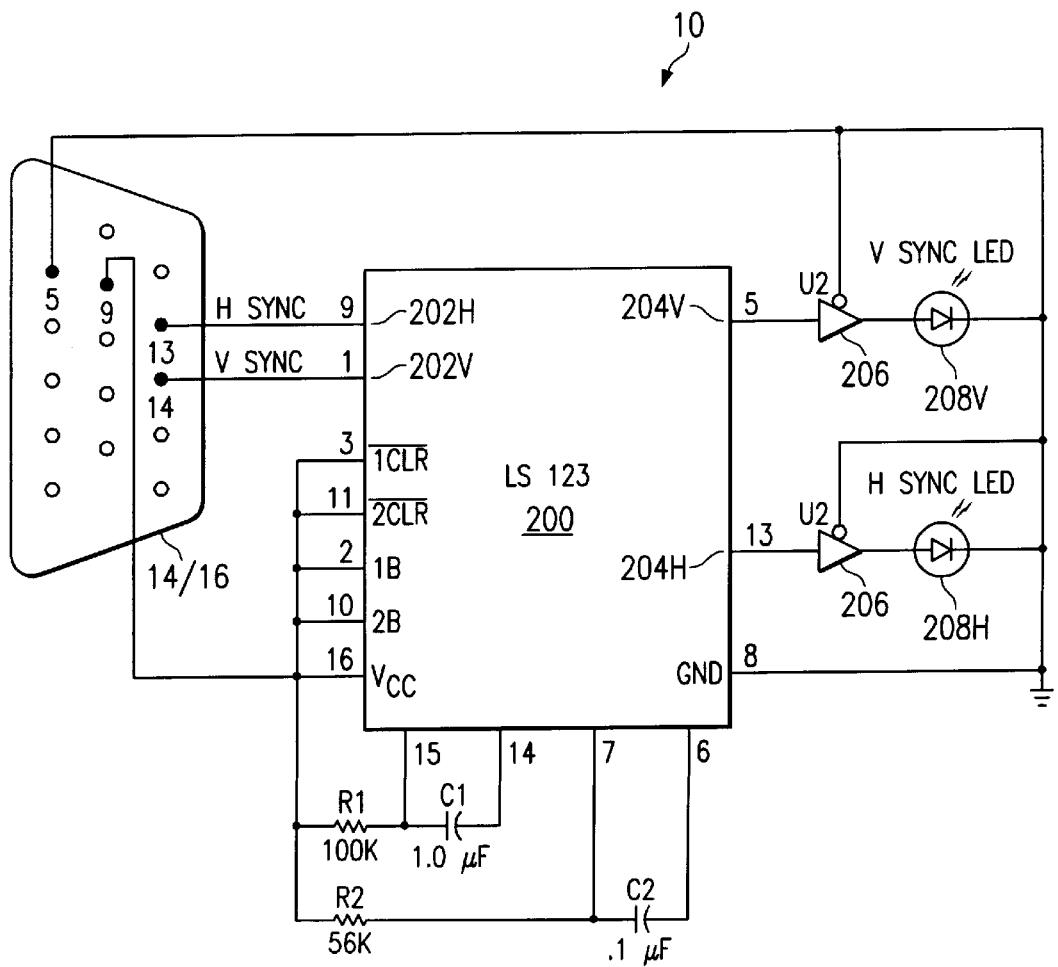
FIG. 2 is a schematic diagram of the compact PC video subsystem test device of FIG. 1.

Referring now to FIG. 2, Hsync and Vsync signals respectively provided at pins 13 and 14 of the VGA connector 16, are input to a monostable multivibrator ("MM") 200 via trigger inputs 202H and 202V, respectively. In one embodiment, the monostable multivibrator is implemented as part number 74LS123 available from Texas Instruments, Inc., of Dallas, Tex., among others.

The existence of Hsync at trigger input 202H of the MM 200 will cause the MM to output a positive-going pulse with a predefined pulse width at an output 204H. Similarly, the existence of Vsync at trigger input 202V of the MM 200 will cause the MM 200 to output a positive-going pulse with a predefined pulse width at an output 204V. Each of the outputs 202H, 202V, is connected, via a driver 206, to a respective LED 208H, 208V, thereby to indicate the presence or absence of Hsync and Vsync, respectively. Specifically, when Hsync is present, the LED 208H will be illuminated; similarly, when Vsync is present, the LED 208V will be illuminated.

The R1/C1 and R2/C2 combinations are selected to produce a prolonged output pulse width at 204H, 204V so that the LEDs 208H, 208V remain illuminated between input (i.e., Vsync and Hsync) pulses. In particular, as long as the values of C1/R1 and C2/R2 are selected such that the positive-going output pulses are longer than the possible longest duration of the respective triggering signal's (Vsync or Hsync) frequency, the output signal will remain high, keeping the corresponding LED illuminated as long as there are triggering signals present, because the output will be re-triggered before the current output pulse expires and starts another round. This is the case regardless of the polarity, frequency duty cycle, or frequency of the triggering signal (Vsync, Hsync).

If the video subsystem 11 is going into one of the predefined energy saving modes, one or both of the Hsync and Vsync signals will be absent, resulting in the dimming of one or both LEDs 208H, 208V.

Most video subsystems currently available have implemented a +5V at a particular pin of the VGA connector. Connection of a Vcc input of the MM 200 to the power supply pin (i.e., pin 9) of the VGA connector 16 provides sufficient power for powering the test device 10 without an external power source.

Another advantageous application of the test device 10 is described below. In the Windows operating system, a protocol is set for conserving monitor energy by sending different combinations of the Hsync and Vsync from the video subsystem. Sending out these specific Hsync and Vsync combinations to the monitor will result in different levels of monitor's energy savings.

In particular, in "ON" mode, both Hsync and Vsync pulses are present. This is the normal operating mode and there are no energy savings involved. In "STAND-BY" mode, there are no Hsync pulses, but Vsync pulses are present as usual. STAND-BY mode provides minimum power savings, but gives the fastest recovery time. In "SUSPEND" mode, there are no Vsync pulses, but Hsync pulses are present as usual. SUSPEND mode provides substantial power savings, but requires more time to recover. Finally, in "OFF" mode, there are no Hsync or Vsync pulses present. The OFF mode provides the maximum power savings, but requires the most time to recover.

Using the test device 10 in combination with a test program that causes the video subsystem to run through the various energy saving modes (ON, STAND-BY, SUSPEND, and OFF), it can be conveniently determined whether the energy saving feature is working correctly or working at all by checking the Hsync and Vsync status via the two LEDs 208H, 208V.

Although an illustrative embodiment has been shown and described, other modifications, changes, and substitutions are intended in the foregoing disclosure. Accordingly, it is appropriate that the appended claims be construed broadly and in a manner consistent with the scope of the disclosure.

What is claimed is:

1. Apparatus for testing operation of a computer having a video subsystem, the apparatus comprising:

a circuit having a pair of triggering signals input to a monostable multivibrator;

the triggering signals each causing the monostable multivibrator to provide a positive-going output pulse;

each output pulse providing a visual indication of the triggering signals; and the visual indication remaining in response to the output pulses being longer than the duration between subsequent pulses of either of the triggering signals.

2. The apparatus of claim 1 wherein the visual indication comprises an LED.

3. The apparatus of claim 1 wherein the circuit comprises a first input for receiving a Hsync signal from the video subsystem, a second input for receiving a Vsync signal from the video subsystem, a first output corresponding to the Hsync signal, and a second output corresponding to the Vsync signal, wherein responsive to receipt of the Hsync signal at the first input, the circuit generates a positive pulse of predetermined length at the first output and responsive to receipt of the Vsync signal at the second input, the circuit generates a positive pulse of predetermined length at the second output.

4. The apparatus of claim 3 wherein the visual indication comprises a first LED connected to the first output for indicating receipt of the Hsync signal and a second LED connected to the second output for indicating receipt of the Vsync signal.

5. The apparatus of claim 4 further comprising a first driver having an input connected to the first output and an output connected to an input of the first LED and a second driver having an input connected to the second output and an output connected to an input of the second LED.

6. The apparatus of claim 1 further comprising a connector for mating with a VGA connector of the computer and passing the video signal to the circuit.

7. The apparatus of claim 1 further comprising means for causing the computer to cycle through a plurality of energy saving modes.

8. Apparatus for testing operation of a computer having a video subsystem, the apparatus comprising:

a circuit having a pair of triggering signals input to a monostable multivibrator;

the triggering signals each causing the monostable multivibrator to provide a positive-going output pulse with a predefined pulse width;

each output pulse providing a visual indication of the triggering signals; and the visual indication remaining in response to the output pulses being longer than the duration between subsequent pulses of either of the triggering signals.

9. The apparatus of claim 8 wherein the visual indication comprises an LED.

10. The apparatus of claim 8 wherein the circuit comprises a first input for receiving a Hsync signal from the video subsystem, a second input for receiving a Vsync signal from the video subsystem, a first output corresponding to the Hsync signal, and a second output corresponding to the Vsync signal, and wherein responsive to receipt of the Hsync signal at the first input, the circuit generates a pulse at the first output and responsive to receipt of the Vsync signal at the second input, the circuit generates a pulse at the second output.

11. The apparatus of claim 10 wherein the visual indication comprises a first LED connected to the first output for indicating receipt of the Hsync signal and a second LED connected to the second output for indicating receipt of the Vsync signal.

12. The apparatus of claim 11 further comprising a first driver having an input connected to the first output and an output connected to an input of the first LED and a second driver having an input connected to the second output and an output connected to an input of the second LED.

13. The apparatus of claim 8 further comprising a connector for mating with a VGA connector of the computer and passing the video signal to the circuit.

14. The apparatus of claim 8 further comprising means for causing the computer to cycle through a plurality of energy saving modes.

15. A method of testing operation of a computer having a video subsystem, the apparatus comprising:

connecting to the computer a circuit having a pair of triggering signals input to a monostable multivibrator;

causing the monostable multivibrator to provide a positive-going output pulse;

providing to a user a visual indication of the triggering signals; and maintaining the visual indication in response to the output pulses being longer than the duration between subsequent pulses of either of the triggering signals.

16. The method of claim 15 wherein the providing a visual indication comprises illuminating an LED.

17. The method of claim 15 wherein the connecting a circuit to receive a video signal comprises connecting the circuit to receive a Vsync signal and connecting the circuit to receive a Hsync signals and the generating a pulse comprises generating a first pulse at a first output of the circuit responsive to receipt of the Hsync signal and generating a second pulse at a second output of the circuit responsive to receipt of the Vsync signal.

18. The method of claim 17 wherein the providing a visual indication comprises illuminating a first LED if the Hsync signal was received and illuminating a second LED if the Vsync signal was received.

19. The method of claim 15 further comprising causing the computer to cycle through a plurality of energy saving modes.

* * * * *